(12) United States Patent
Bogner et al.

(10) Patent No.: US 7,838,357 B2
(45) Date of Patent: Nov. 23, 2010

(54) OPTOELECTRONIC COMPONENT

(75) Inventors: Georg Bogner, Lappersdorf (DE);
Herbert Brunner, Regensburg (DE);
Gertrud Kräuter, Regensburg (DE);
Gunter Waitl, Regensburg (DE)

(73) Assignee: Osram Opto Semiconductors GmbH, Regensberg (DE)

( * ) Notice: Subject to any disclaimer, the term of this patent is extended or adjusted under 35 U.S.C. 154(b) by 65 days.

(21) Appl. No.: 10/494,160

(22) PCT Filed: Oct. 28, 2002

(86) PCT No.: PCT/DE02/04025
§ 371 (c)(1),
(2), (4) Date: Feb. 4, 2005

(87) PCT Pub. No.: WO03/038912
PCT Pub. Date: May 8, 2003

(65) Prior Publication Data
US 2005/0245018 A1    Nov. 3, 2005

(30) Foreign Application Priority Data
Oct. 31, 2001   (DE) ................. 101 53 259

(51) Int. Cl.
*H01L 218/8238* (2006.01)
(52) U.S. Cl. ..................................... 438/200
(58) Field of Classification Search ........... 257/79–103, 257/116, 117, 432–437, 749, E33.056–E33.059, 257/E25.032, 222, 59; 438/2, 3, 4, 5, 6, 8, 438/18, 200
See application file for complete search history.

(56) References Cited

U.S. PATENT DOCUMENTS

| | | | |
|---|---|---|---|
| 4,152,624 A | 5/1979 | Knaebel | |
| 4,827,118 A | 5/1989 | Shibata et al. | |
| 4,916,359 A | 4/1990 | Jönsson | |
| 5,035,483 A | 7/1991 | Waitl et al. | |
| 5,040,868 A | 8/1991 | Waitl et al. | |
| 5,227,634 A | 7/1993 | Ryuo et al. | |

(Continued)

FOREIGN PATENT DOCUMENTS

DE    38 87 372 T2    5/1994

(Continued)

OTHER PUBLICATIONS

Mollmer et al. "Siemens-SMT-TOP-LED-LEDs for Surface Mounting", Siemens Components 29 (1991) No. 4-5, pp. 147-149.*
Luckiesh M., "Spectral Reflectance of Common Materials in the UV Region", Journal of the Optical Society of America, 1929, vol. 19, pp. 1-6, Jul. 1, 1929.
Egan, W. et al., "Integrating Spheres for Measurements between 0.185-12 μm", Applied Optics, vol. 14, No. 5, pp. 1137-1142, May 1, 1975.

(Continued)

*Primary Examiner*—Dao H Nguyen
*Assistant Examiner*—Tram H Nguyen
(74) *Attorney, Agent, or Firm*—Cohen Pontani Lieberman & Pavane LLP

(57) ABSTRACT

Optoelectronic component, having a housing body (2), an optoelectronic semiconductor chip (3) arranged in a recess (6) of the housing body, and having electrical terminals (1A, 1B), the semiconductor chip being electrically conductively connected to the electrical terminals of the leadframe. The housing body (2) is formed from an encapsulation material, with a filler which has a high degree of reflection in a wavelength range from the UV range.

19 Claims, 3 Drawing Sheets

U.S. PATENT DOCUMENTS

| | | | |
|---|---|---|---|
| 5,707,437 | A | 1/1998 | Niedenzu et al. |
| 5,798,536 | A | 8/1998 | Tsutsui |
| 5,985,696 | A | 11/1999 | Brunner et al. |
| 6,066,861 | A * | 5/2000 | Hohn et al. .................... 257/99 |
| 6,069,440 | A * | 5/2000 | Shimizu et al. ............. 313/486 |
| 6,245,259 | B1 * | 6/2001 | Hohn et al. ............ 252/301.36 |
| 6,274,890 | B1 * | 8/2001 | Oshio et al. .................... 257/98 |
| 6,351,069 | B1 * | 2/2002 | Lowery et al. .............. 313/512 |
| 6,514,328 | B1 | 2/2003 | Katoh et al. |
| 6,580,097 | B1 * | 6/2003 | Soules et al. ................ 257/100 |
| 6,610,563 | B1 | 8/2003 | Waitl et al. |
| 6,680,568 | B2 * | 1/2004 | Fujiwara et al. ............. 313/501 |
| 6,812,500 | B2 * | 11/2004 | Reeh et al. .................... 257/98 |
| 6,841,933 | B2 * | 1/2005 | Yamanaka et al. .......... 313/512 |
| 2002/0043926 | A1 * | 4/2002 | Takahashi et al. ........... 313/503 |
| 2002/0180904 | A1 | 12/2002 | Lauzun et al. |
| 2004/0016908 | A1 | 1/2004 | Hohn et al. |

FOREIGN PATENT DOCUMENTS

| | | |
|---|---|---|
| DE | 195 35 777 A1 | 3/1997 |
| DE | 196 38 667 A1 | 4/1998 |
| DE | 197 55 734 A1 | 6/1999 |
| DE | 695 05 955 T2 | 8/1999 |
| EP | 0 400 175 A1 | 5/1989 |
| EP | 0 400 176 A1 | 12/1990 |
| EP | 0 854 523 A | 7/1998 |
| EP | 1 022 558 | 7/2000 |
| EP | 1 187 228 A1 | 3/2002 |
| EP | 1 246 265 A1 | 10/2002 |
| JP | 54 069067 | 6/1979 |
| JP | 62-192443 * | 8/1987 |
| JP | 4-290984 | 10/1992 |
| JP | 05-066304 | 3/1993 |
| JP | 10-261821 | 9/1998 |
| JP | 10-281990 | 10/1998 |
| JP | 11-254622 | 9/1999 |
| JP | 11-254853 | 9/1999 |
| JP | 2000-206035 | 7/2000 |
| JP | 2001-70783 | 3/2001 |
| JP | 2003-517644 | 5/2006 |
| WO | WO 97 50132 A | 12/1997 |
| WO | WO 98/54929 | 12/1998 |
| WO | WO 01 22501 A | 3/2001 |

OTHER PUBLICATIONS

Frank Möllmer et al., "Siemens-SMT-TOP-LED-LEDs for Surface Mounting", Siemens Components 29 (1991), No. 4-5, pp. 147-149.

* cited by examiner

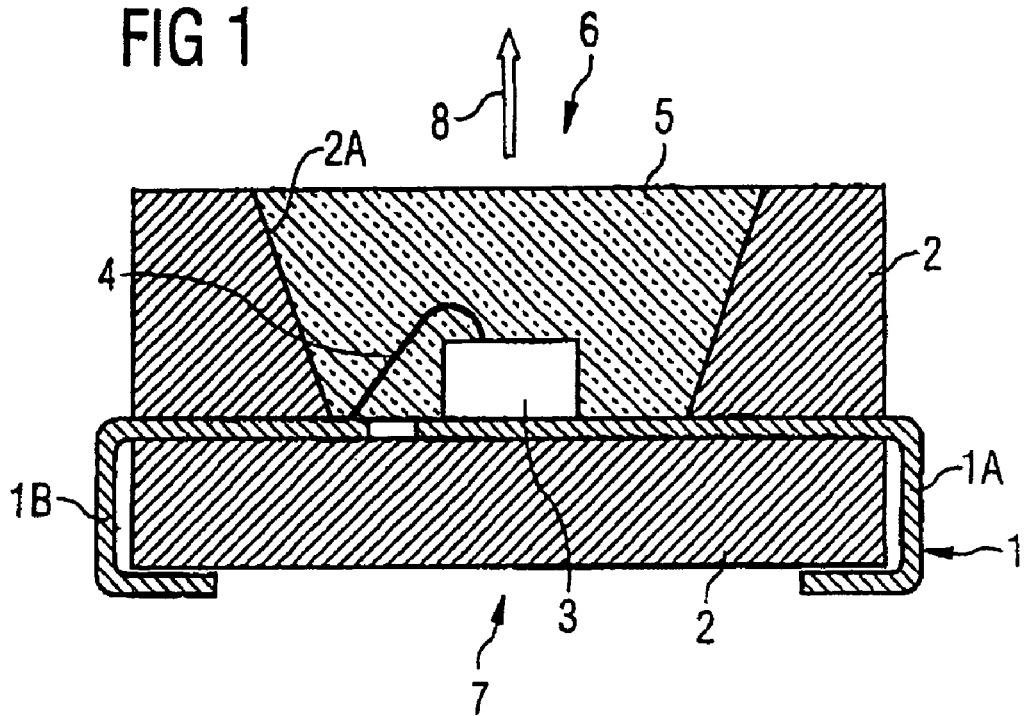
FIG 1
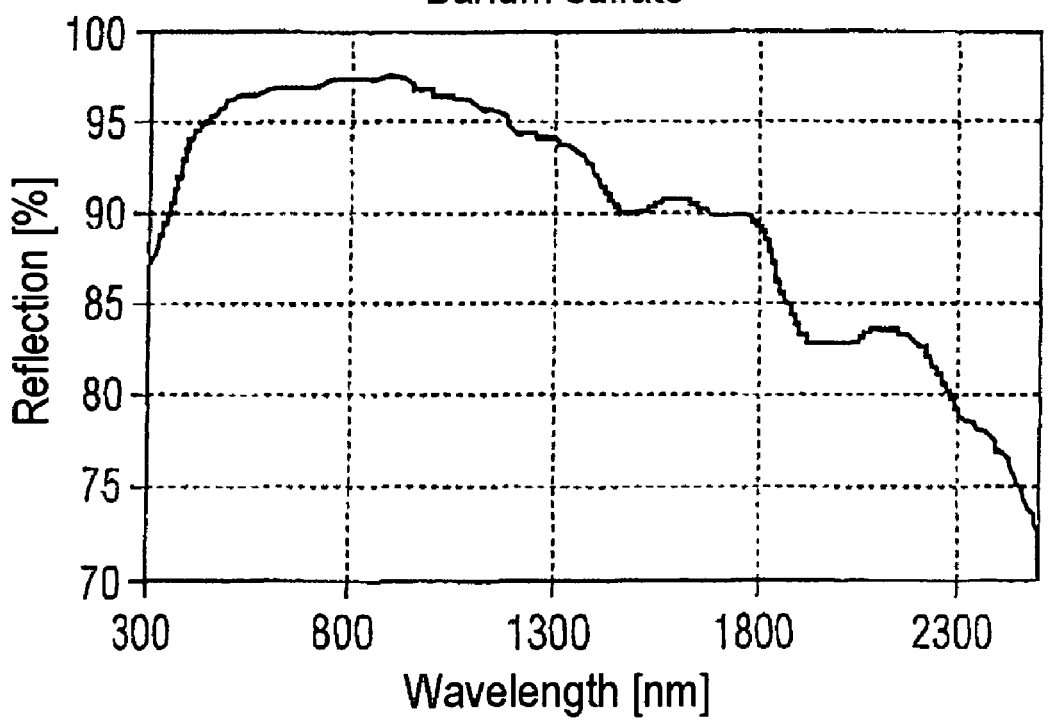
FIG 2A  Barium sulfate

OPTOELECTRONIC COMPONENT

RELATED APPLICATIONS

This is a U.S. national stage of International application PCT/DE02/04025 filed 28 Oct. 2002.

This patent application claims priority of German patent application No. 101 53 259.8 filed 31 Oct. 2001, the disclosure of which is hereby incorporated by reference.

The invention relates to an optoelectronic component, in particular a radiation-emitting, surface-mountable component, having a housing body produced from an encapsulation material, an optoelectronic semiconductor chip arranged at the housing body, and having electrical terminals, to which the semiconductor chip is electrically conductively connected.

BACKGROUND OF THE INVENTION

The term "encapsulation material" encompasses in the present context in particular any material which can be brought to an envisaged form by means of casting, injection, injection molding or transfer molding. This includes in particular reaction resins such as epoxyresins, acrylic resins and silicone resins. The use of ceramic or vitreous materials is also conceivable.

In the case of conventional surface-mountable optoelectronic components first of all a prehoused device is produced by encapsulating a prefabricated leadframe with a suitable plastics material by injection molding, said plastics material forming a housing body of the device. Said housing body has a depression for example at the top side, into which depression leadframe terminals are introduced from two opposite sides. A semiconductor chip such as an LED chip for example, is adhesively bonded and electrically contact-connected on one of said leadframe terminals. The other leadframe terminal is connected to the semiconductor chip via a bonding wire. A generally transparent potting composition is filled into the depression. This basic form of surface-mountable optoelectronic components is disclosed for example in the article "SIEMENS SMT-TOPLED für die Oberflächenmontage" ["SIEMENS SMT-TOPLED for surface mounting"] by F. Möllmer and G. Waitl, Siemens Components 29 (1991), issue 4, pages 147-149.

In the case of these known surface-mountable designs, a highly directional radiation can be achieved by the sidewalls of the depression being formed in such a way, for example as suitable inclined or curved areas, that they form a reflector for a radiation emitted laterally or rearward from the semiconductor chip, said reflector deflecting said radiation toward the desired radiation direction. Depending on the form of housing or form of reflector, the component may be constructed as a so-called toplooker, i.e. with a main radiating direction perpendicular or at a steep angle with respect to the mounting plane of the component, or as a so-called sidelooker, i.e. with a main radiating direction parallel or at a shallow angle with respect to the mounting plane of the component. Examples of a toplooker and of a sidelooker with the corresponding forms of housing are shown for example in FIG. 2 and FIG. 3, respectively, of EP 0 400 175 A1.

A thermoplastic material or a thermosetting plastic material is usually used for the housing body of the component. In a preferred embodiment, which is used in practice, a polyphthalamide which is filled with glass fibers and colored white with a $TiO_2$ filler is used as plastics material for the housing body.

For the sake of completeness it should also be pointed out that it is additionally known to form such optoelectronic components with additional optical elements in order to improve their radiating characteristics or to adapt them to specific applications. Thus, by way of example, EP 0 400 176 A1 and DE 197 55 734 A1 show surface-mountable optoelectronic components of the type described in the introduction which are respectively provided with an additional optical device on the housing body and/or the potting composition.

It has been found that when using semiconductor chips which emit radiation from the blue spectral range and/or from the ultraviolet spectral range, in particular GaN-based semiconductor chips in which a radiation-emitting active layer has a GaN, InGaN, AlGaN or InGaIN material, the radiation efficiency from the component is unexpectedly low.

SUMMARY OF THE INVENTION

One object of the present invention is to provide an optoelectronic component of the type mentioned in the introduction with a chip that emits and/or receives ultraviolet and/or blue radiation, in such a way that the radiation efficiency from the component is improved.

A further object of the present invention is to provide an optoelectronic component of the type mentioned in the introduction in which the housing body is resistant to aging.

These and other objects are attained in accordance with one aspect of the invention directed to an optoelectronic component having a housing body produced from an encapsulation material, and having a recess, an optoelectronic semiconductor chip arranged in the recess of the housing body, and having electrical terminals, to which the semiconductor chip is electrically conductively connected. The encapsulation material contains a filler which has a degree of reflection which is greater than or equal to 0.5 for electromagnetic radiation from the UV range According to an embodiment of the present invention, the housing body of the optoelectronic component is formed from a plastics material with a filler, the filler having a high reflectivity in a wavelength range below approximately 500 nm.

The invention is based on the insight that, in the case of the materials conventionally used for the housing body of the optoelectronic components, the filler, i.e. the white-coloring $TiO_2$ filler in the case described above, significantly influences the radiation efficiency from a component. As illustrated in FIGS. 2C and 3, the $TiO_2$ filler has a good reflectivity above approximately 480 to 500 nm. The reflectivity greatly decreases for shorter wavelengths so that a significant proportion of the light impinging on the housing body is absorbed by the latter in this lower wavelength range and, consequently, the efficiency of the component distinctly decreases in this wavelength range. Furthermore, the energy absorbed by the filler contributes to the aging process of the plastics material.

If use is made, as proposed according to the present invention, of a filler which has a high reflectivity even in a wavelength range below approximately 500 nm, then this on the one hand increases the efficiency of the optoelectronic component in the wavelength ranges below 500 nm and on the other hand protects the housing body against aging.

Examples of suitable fillers are barium sulfate, anatase (this is a modification of $TiO_2$) and Teflon (PTFE), which are preferably added with a proportion by volume of up to 50%. A furthermore preferred proportion by volume lies in the range of between approximately 5% and approximately 15%.

A thermoplastic or a thermosetting plastic such as polyphthalamide, for example, is preferably used for the plastics material of the housing body.

For the purpose of mechanical stabilization, inter alia, the encapsulation material may additionally preferably be admixed with glass fibers or mineral filler.

The component according to the invention is particularly preferably suitable for producing light-emitting diode components with semiconductor chips in which at least the radiation-emitting zone at least partly comprises a GaN-based semiconductor material, in particular a GaN, InGaN, AlGaN and/or InGaAlN semiconductor material. Depending on the composition present in each case the emission spectrum of such semiconductor chips usually lies substantially in the blue and/or ultraviolet spectral range.

The recess of the housing body is preferably filled with a material that is transmissive at least to part of the radiation emitted by the semiconductor chip. In order to produce light-emitting diode components that radiate polychromatic light and/or in order to convert an ultraviolet or blue radiation proportion of the chip into longer-wave radiation, the transmissive material may be admixed with luminescent material particles which absorb at least part of the electromagnetic radiation having wavelengths from the ultraviolet and/or blue spectral range and emit longer-wave electromagnetic radiation in comparison therewith, in particular electromagnetic radiation that is visible or better visible to the human eye.

BRIEF DESCRIPTION OF THE DRAWINGS

FIG. 1 shows a diagrammatic illustration of a surface-mountable optoelectronic component in which the present invention can be used;

FIGS. 2A to 2C show various reflection spectra for different materials which can be used for example according to the present invention as fillers in the plastics material of the housing body of the component illustrated in FIG. 1.

DETAILED DESCRIPTION OF THE DRAWINGS

Figure 2B:
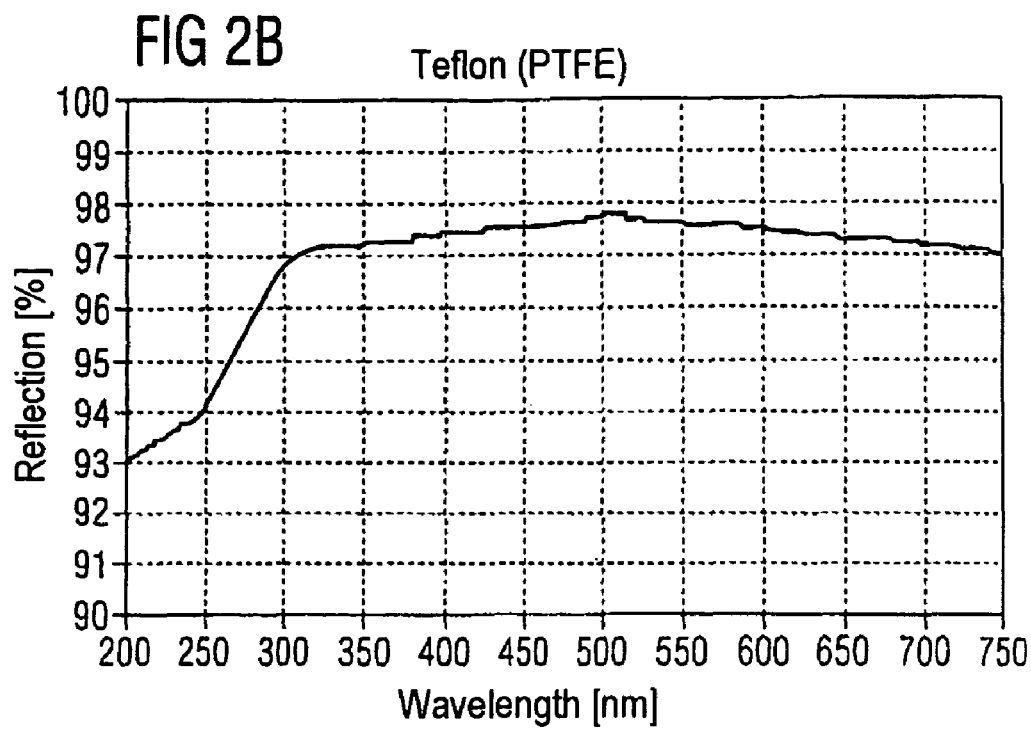

FIG. 1 illustrates a diagrammatic illustration of a vertical cross section, with house mounting side 7 at the bottom, through an optoelectronic component in which the present invention is used. The housing body 2 is formed by encapsulating a leadframe 1 with a suitable plastics material by injection molding while at the same time forming the housing body 2. The housing body 2 has a recess 6, which is preferably arranged centrally with respect to the housing body. A semiconductor chip 3, such as, for example, an optoelectronic transmitter or receiver, in the present case for example a light-emitting diode chip based on GaN, InGaN, AlGaN and/or InGaAlN semiconductor material, is arranged in the recess. Electrical contact areas of the chip 3 are electrically conductively connected to electrical terminals 1A, 1B of the leadframe 1 by means of a bonding wire 4 or by means of an electrically conductive connecting means for chip bonding.

The inner areas 2A of the recess 6 of the housing body 2 are formed obliquely in such a way that they deflect a radiation emitted laterally from the chip 3 at least largely toward a radiating direction 8 of the chip 3. By virtue of the selection—described below—of a suitable material for the housing body 2 with a high reflectivity, these oblique inner areas 2A serve as reflectors in order to increase the radiating power or the reception sensitivity of the optoelectronic component.

The optoelectronic semiconductor chip 3 is embedded in a sheathing material 5, which is at least partly transmissive at least to part of the electromagnetic radiation emitted by said chip. In the present case, that surface of the sheathing material 5 which is remote from the semiconductor chip 3 essentially terminates with the surface of the housing body 2. However, it is pointed out that, within the scope of the present invention, other filling heights of the sheathing material 5 in the recess 6 of the carrier body 1 may also be chosen, of course, as required. Furthermore, a suitable optical device such as an optical lens, for example, may also be applied to the housing body 2 with sheathing material 5 thus formed, in order to adapt the optical properties of the components to special application possibilities.

The material used for the sheathing material 5 is usually a radiation-transmissive material which preferably has UV-initiated or light-initiated curing properties. A particularly preferred sheathing material 5 contains a UV-initiated or light-initiated curing epoxy resin which is insipiently cured or pre-fixed within a few seconds by being exposed to light or UV radiation and is completely cured thermally at a later point in time.

Depending on the choice of material of the housing body 2 and the desired optical properties of the optoelectronic component, the sheathing material 5 contains in addition to its main constituent of the epoxy resin specified above, further constituents in order to set the strength of bonding with the housing body material, the insipient curing and bulk curing time, the light transmissivity, the refractive index, the thermostability, the mechanical hardness, etc., as desired.

In order to produce light-emitting diode components that radiate polychromatic light and/or in order to convert an ultraviolet or blue radiation proportion of the chip into longer-wave radiation, the sheathing material 5 is admixed with luminescent material particles. The latter absorb at least part of the electromagnetic radiation emitted by the chip 3, for example having wavelengths from the ultraviolet and/or blue spectral range, and then emit electromagnetic radiation with longer wavelengths in comparison with the absorbed radiation, in particular wavelengths that are visible or better visible to the human eye.

An encapsulation material which contains specific fillers is used for the housing body 2 of the component. Said encapsulation material, which forms the main constituent of the housing body 2, is in this case preferably formed from a thermoplastic or a thermosetting plastic. What is particularly suitable for this is polyphthalamide, for example, which may be admixed with glass fibers and/or a mineral filler for the purpose of mechanical stabilization. One example of a suitable mineral filler is silicon dioxide particles.

Barium sulfate ($BaSO_4$) is advantageously used as a filler, which is added with a proportion by volume of approximately 5 to 15%, preferably 8 to 12%, and particularly preferably approximately 10%. Barium sulfate is a material which has a reflectivity of more than 90% in a wavelength range of between approximately 350 and 800 nm, as is illustrated in the reflection spectrum of FIG. 2A.

On account of this high reflectivity even for wavelengths below 500 nm, blue light and UV light is also reflected from the inner areas 2A of the housing body 2. Consequently, the component having such a housing body exhibits a good efficiency even for applications in this spectral range since a higher proportion of the radiation generated by the semiconductor chip 3 can be emitted by the component or a higher proportion of the radiation received by the component can be detected by the semiconductor chip 3.

Moreover, it is advantageous that, through the addition of the filler, the housing body 2 is more resistant to aging in comparison with conventional housing bodies since less absorption energy occurs in the housing body. Since barium sulfate has a very high reflectivity not only below 500 nm but right into the infrared range, an optoelectronic component having such a housing body can be used universally.

An alternative suitable filler is Teflon (PTFE), the reflectivity of which is illustrated in the diagram of FIG. 2B. As can be gathered from the reflection spectrum of FIG. 2B, Teflon exhibits a very high reflectivity of significantly more than 90% in a range of approximately 300 to 800 nm.

Figure 2C:
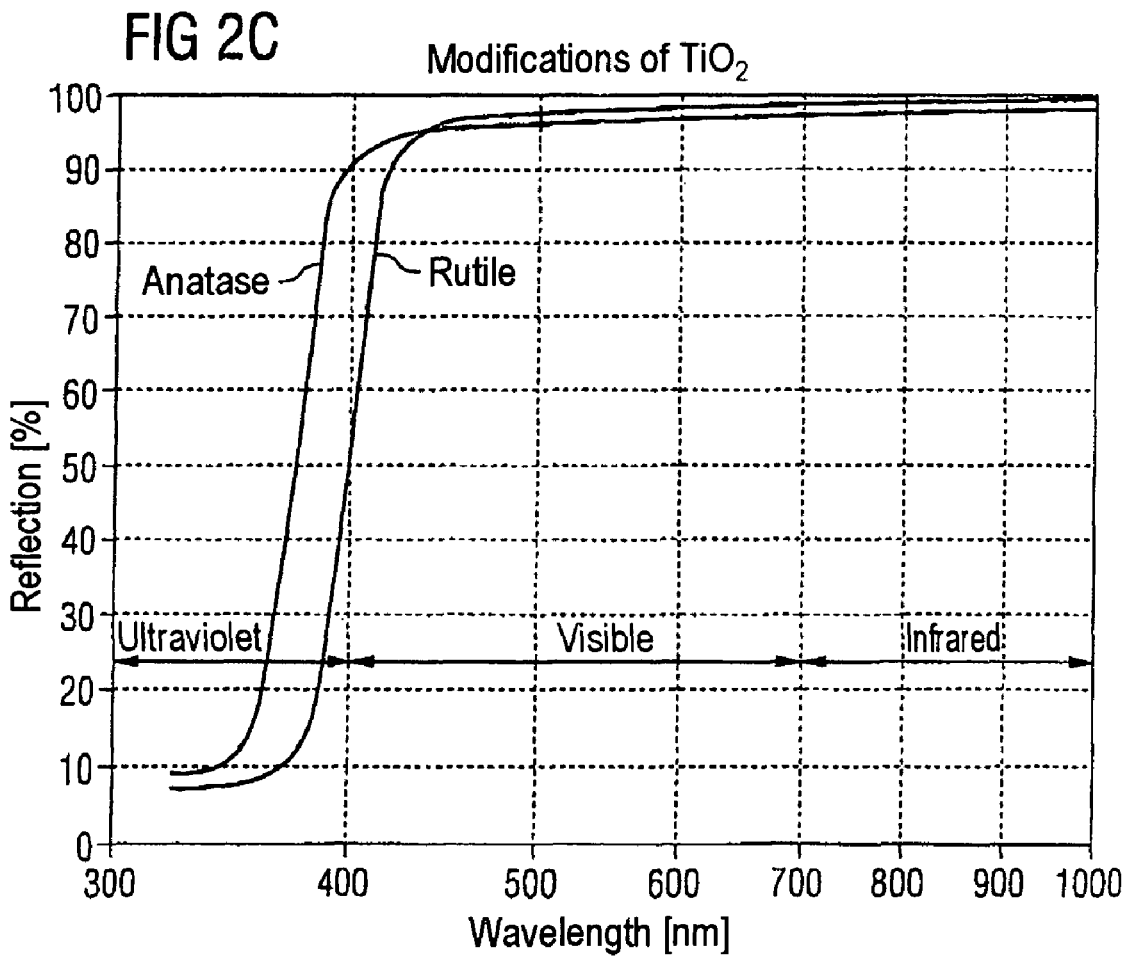
Figure 3:
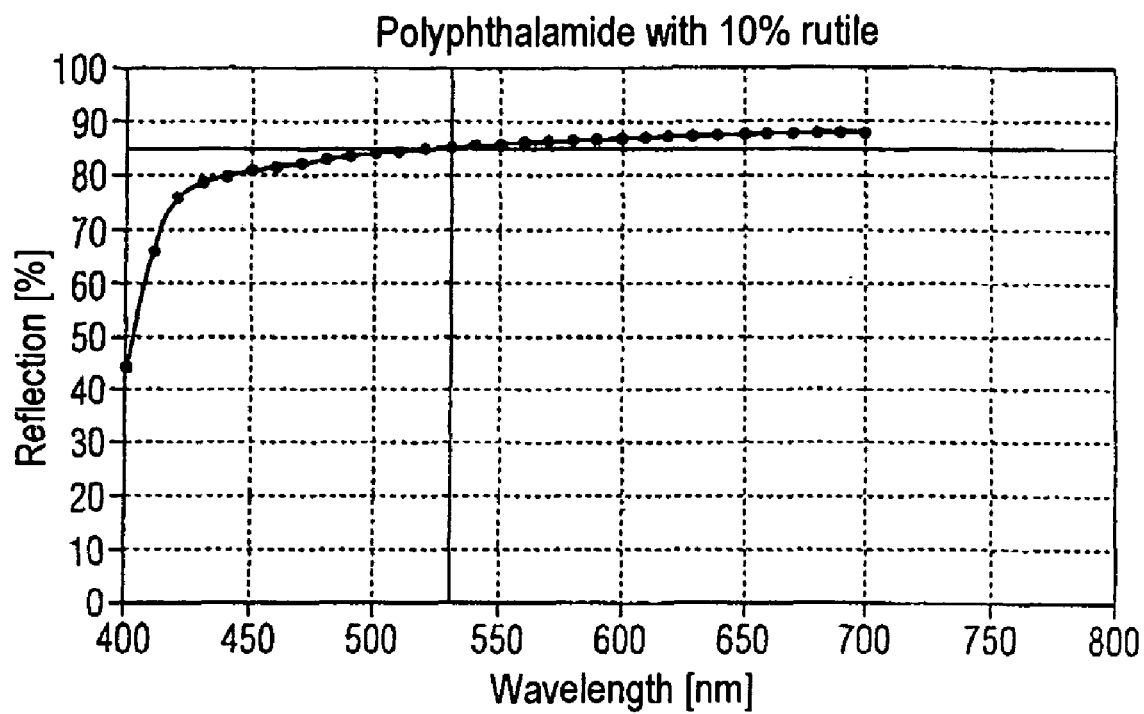
FIG. 3 shows a reflective spectrum for a housing body of an optoelectronic component according to the prior art.

An example of a further alternative filler is anatase, a particular modification of $TiO_2$, the reflection spectrum of which is shown in the diagram of FIG. 2C. The reflectivity of rutile used hitherto is plotted for comparison in the diagram of FIG. 2C. Like rutile, anatase is a particular modification of $TiO_2$, the titanium and oxygen atoms being packed more densely in the case of rutile and rutile having a higher density and a higher refractive index than anatase.

It goes without saying that the present invention is not just restricted to the materials expressly specified above for the filler and the plastics material. On the basis of the insight that a filler having a high reflectivity even in the blue and/or UV range is to be used, the person skilled in the art can also use other materials having corresponding properties as a filler without departing from the basic concept of the invention.

The scope of protection of the invention is not restricted by the description of the invention on the basis of the exemplary embodiments. In fact, the invention covers any novel feature as well as any combination of features which, in particular, includes any combination of features in the patent claims, even if this combination is not explicitly stated in the patent claims.

The invention claimed is:

1. An optoelectronic component comprising:
   a housing body formed of an encapsulation material and defining a recess;
   an optoelectronic semiconductor chip disposed in the recess of the housing body; and
   electrical terminals electrically coupled to the semiconductor chip;
   wherein the encapsulation material comprises a filler which has a degree of reflection which is greater than or equal to 0.5 for electromagnetic radiation of one or more wavelengths within a wavelength range between 300 nm to 400 nm, inclusive,
   wherein the housing body forming the recess is formed as a reflector of at least part of the radiation emitted by the semiconductor chip and wherein the encapsulation material is disposed on a side of the recess, formed as a reflector, facing away from the semiconductor chip, wherein the reflector is configured to reflect the radiation in a direction away from a plane on which the optoelectronic semiconductor chip is disposed, and
   wherein the optoelectronic semiconductor chip is embedded in a sheathing material which is transmissive at least to part of the radiation emitted by said optoelectronic semiconductor chip.

2. The optoelectronic component as claimed in claim 1, wherein the proportion of the filler in the encapsulation material is between 5% by volume and 50% by volume inclusive.

3. The optoelectronic component as claimed in claim 1, wherein the filler comprises a material from the group consisting of barium sulfate, anatase and polytetrafluoroethylene or a mixture comprising two or more of these materials.

4. The optoelectronic component as claimed in claim 1, wherein the encapsulation material is a thermoplastic or a thermosetting plastic.

5. The optoelectronic component as claimed in claim 4, wherein the encapsulation material is polyphthalamide.

6. The optoelectronic component as claimed in claim 1, wherein the encapsulation material is admixed with glass fibers or mineral filler.

7. The optoelectronic component as claimed in claim 1, wherein the semiconductor chip contains a radiation-emitting zone, which at least partly comprises a GaN-based semiconductor material, in particular a GaN, InGaN, AlGaN and/or InGaAlN semiconductor material.

8. The optoelectronic component as claimed in claim 1, wherein the semiconductor chip contains a radiation-emitting zone, which emits electromagnetic radiation having wavelengths from the ultraviolet spectral range.

9. The optoelectronic component as claimed in claim 8, wherein the recess is filled with a sheathing material which is transmissive at least to part of the radiation emitted by the semiconductor chip and contains luminescent material particles which absorb at least part of the electromagnetic radiation having wavelengths from the ultraviolet spectral range and emit longer-wave electromagnetic radiation in comparison therewith.

10. The optoelectronic component as claimed in claim 9, wherein the longer-wave electromagnetic radiation has wavelengths from the spectral range that is visible to the human eye.

11. The optoelectronic component as claimed in claim 1, wherein said encapsulation material comprises a plastics material.

12. The optoelectronic component as claimed in claim 1, wherein said degree of reflection is greater than or equal to 0.7.

13. The optoelectronic component as claimed in claim 1, wherein the proportion of the filler in the encapsulation material is between 5% by volume and 15% by volume, inclusive.

14. The optoelectronic component as claimed in claim 1, wherein the semiconductor chip contains a radiation-emitting zone, which at least partly comprises at least one of the group of GaN, InGaN, AlGaN and InGaAlN semiconductor material.

15. An optoelectronic component comprising:
   a housing body formed of an encapsulation material defining a recess;
   an optoelectronic semiconductor chip disposed in the recess of the housing body; and
   electrical terminals electrically coupled to the semiconductor chip;
   wherein the encapsulation material comprises a filler comprising anatase,
   wherein the encapsulation material is disposed on a side of the recess, formed as a reflector, facing away from the semiconductor chip,
   wherein the reflector is configured to reflect the radiation in a direction away from a plane on which the optoelectronic semiconductor chip is disposed, and
   wherein the optoelectronic semiconductor chip is embedded in a sheathing material which is transmissive at least to part of the radiation emitted by said optoelectronic semiconductor chip.

16. An optoelectronic component comprising:
   a housing body formed of an encapsulation material defining a recess;
   an optoelectronic semiconductor chip disposed in the recess of the housing body; and electrical terminals electrically coupled to the semiconductor chip;

wherein the encapsulation material comprises a filler comprising polytetrafluoroethylene, wherein the encapsulation material is disposed on a side of the recess, formed as a reflector, facing away from the semiconductor chip, wherein the reflector is configured to reflect the radiation in a direction away from a plane on which the optoelectronic semiconductor chip is disposed, and wherein the optoelectronic semiconductor chip is embedded in a sheathing material which is transmissive at least to part of the radiation emitted by said optoelectronic semiconductor chip.

17. The optoelectronic component as claimed in claim 16, wherein the housing body defines a recess, said optoelectronic semiconductor chip being arranged in the recess of the housing body, and wherein the housing body forming the recess is formed as a reflector of at least part of the radiation emitted by the semiconductor chip.

18. An optoelectronic component comprising:
a housing body formed of an encapsulation material and defining a recess;
an optoelectronic semiconductor chip disposed in the recess of the housing body; and
electrical terminals electrically coupled to the semiconductor chip;

wherein the encapsulation material comprises a filler comprising barium sulfate, and wherein the housing body forming the recess is formed as a reflector of at least part of the radiation emitted by the semiconductor chip, wherein the encapsulation material is disposed on a side of the recess, formed as a reflector, facing away from the semiconductor chip, wherein the reflector is configured to reflect the radiation in a direction away from a plane on which the optoelectronic semiconductor chip is disposed, and wherein the optoelectronic semiconductor chip is embedded in a sheathing material which is transmissive at least to part of the radiation emitted by said optoelectronic semiconductor chip.

19. The optoelectronic component as claimed in claim 1, wherein the proportion of the filler in the encapsulation material is between 5% by volume and 15% by volume inclusive.

* * * * *